(12) United States Patent
Lee et al.

(10) Patent No.: US 6,611,433 B1
(45) Date of Patent: Aug. 26, 2003

(54) MOTHERBOARD MODULE

(75) Inventors: Chih-Hsiang Lee, Taoyuan (TW); Guo-Ming Huang, Keelung (TW); Ching-Yuan Wang, Taipei (TW)

(73) Assignee: Quanta Computer Inc., Tao Yuan Shien (TW)

( * ) Notice: Subject to any disclaimer, the term of this patent is extended or adjusted under 35 U.S.C. 154(b) by 0 days.

(21) Appl. No.: 10/164,096

(22) Filed: Jun. 5, 2002

(51) Int. Cl.[7] ............................................... H05K 1/14
(52) U.S. Cl. ..................... 361/736; 361/752; 361/753; 361/785; 361/788; 361/796; 361/803; 361/784
(58) Field of Search ............................. 361/784, 785, 361/801, 803, 788, 752, 796, 736, 727; 439/62

(56) References Cited

U.S. PATENT DOCUMENTS

| | | | | |
|---|---|---|---|---|
| 5,557,506 A | * | 9/1996 | Wood et al. ................ 361/796 |
| 5,895,278 A | * | 4/1999 | Humphrey ................... 439/101 |
| 5,973,926 A | * | 10/1999 | Sacherman et al. ......... 361/759 |
| 6,215,674 B1 | * | 4/2001 | Bertolami ................... 361/807 |
| 6,411,506 B1 | * | 6/2002 | Hipp et al. ................. 361/686 |
| 6,535,394 B1 | * | 3/2003 | Hirzmann ................... 361/761 |

* cited by examiner

*Primary Examiner*—David Martin
*Assistant Examiner*—Thanh Yen Tran

(57) ABSTRACT

A motherboard module includes a motherboard, a backboard, and a modular mechanism. The modular mechanism for fast assembly and disassembly of a motherboard includes an upright, an upstanding structure, and a fastener. The upstanding structure is used for positioning the motherboard. Since the upstanding structure is perpendicularly attached to the back edge of the motherboard and the backboard is adhered to one surface of the upstanding structure, the fastener presses and engages the backboard so that the upright clinches the slit in the motherboard and the motherboard is thus secured.

22 Claims, 6 Drawing Sheets

MOTHERBOARD MODULE

BACKGROUND OF THE INVENTION

1. Field of the Invention

The invention relates in general to a motherboard assembly structure, and more particularly to a motherboard module for easy assembly and fast disassembly.

2. Description of the Related Art

The computer casing typically includes a metal chassis to which the various devices and components of the computer are attached. The computer casing also includes an outer shell that covers the chassis and encloses the components mounted on the chassis so that the computer components can be protected from dust and certain other environmental hazards. The chassis has several device bays for holding computer devices, such as a hard disk drive, a CD-ROM drive, a floppy disk drive, and other computer components. The chassis also has places or brackets for holding a power supply and various boards, including the computer's motherboard.

Presently, most motherboards are secured to the chassis by screws. Screws are inserted through the openings in the chassis and into the openings that are provided in the motherboard for this purpose. Such screws securely attach the motherboard to the chassis. In addition, screws are removable. Therefore, it requires removing the screws to disassemble the motherboard from the chassis if the motherboard needs to be repaired or replaced. However, the need to individually insert each such screw renders initial assembly of a computer time-consuming. This is particularly an issue for a computer assembler seeking to assemble a large number of computers. Also, such screw assembly requires substantial dexterity on the part of the assembly worker to hold the motherboard in place while inserting the screw, and operating the screwdriver. In addition, the devices must be securely attached to the chassis.

Because of the volume of the computer business, there has been a long felt need for a motherboard assembly structure that does not require the use of screws for securing the motherboard to the chassis and allow for easy and rapid assembly and disassembly of the motherboard.

SUMMARY OF THE INVENTION

It is therefore an object of the invention to provide a motherboard module for tool-less assembly and disassembly. The motherboard is assembled into the chassis by a simple push-in action and secured by a snap-on type fastener. It achieves easy assembly and fast disassembly without the use of screws and tools.

The invention achieves the above-identified objects by providing a motherboard module, including a motherboard, a backboard, and a modular mechanism. The modular mechanism for fast assembly and disassembly of a motherboard includes an upright, an upstanding structure, and a fastener. The upright is disposed on the bottom surface of a chassis. The motherboard at least has a slit for receiving the upright. The upstanding structure is used for positioning the motherboard. Since the upstanding structure is perpendicularly attached to the back edge of the motherboard and the backboard is adhered to one surface of the upstanding structure, the fastener presses and engages the backboard so that the upright clinches the slit in the motherboard and the motherboard is thus secured.

Other objects, features, and advantages of the invention will become apparent from the following detailed description of the preferred but non-limiting embodiments. The following description is made with reference to the accompanying drawings.

DETAILED DESCRIPTION OF THE INVENTION

Figure 1:
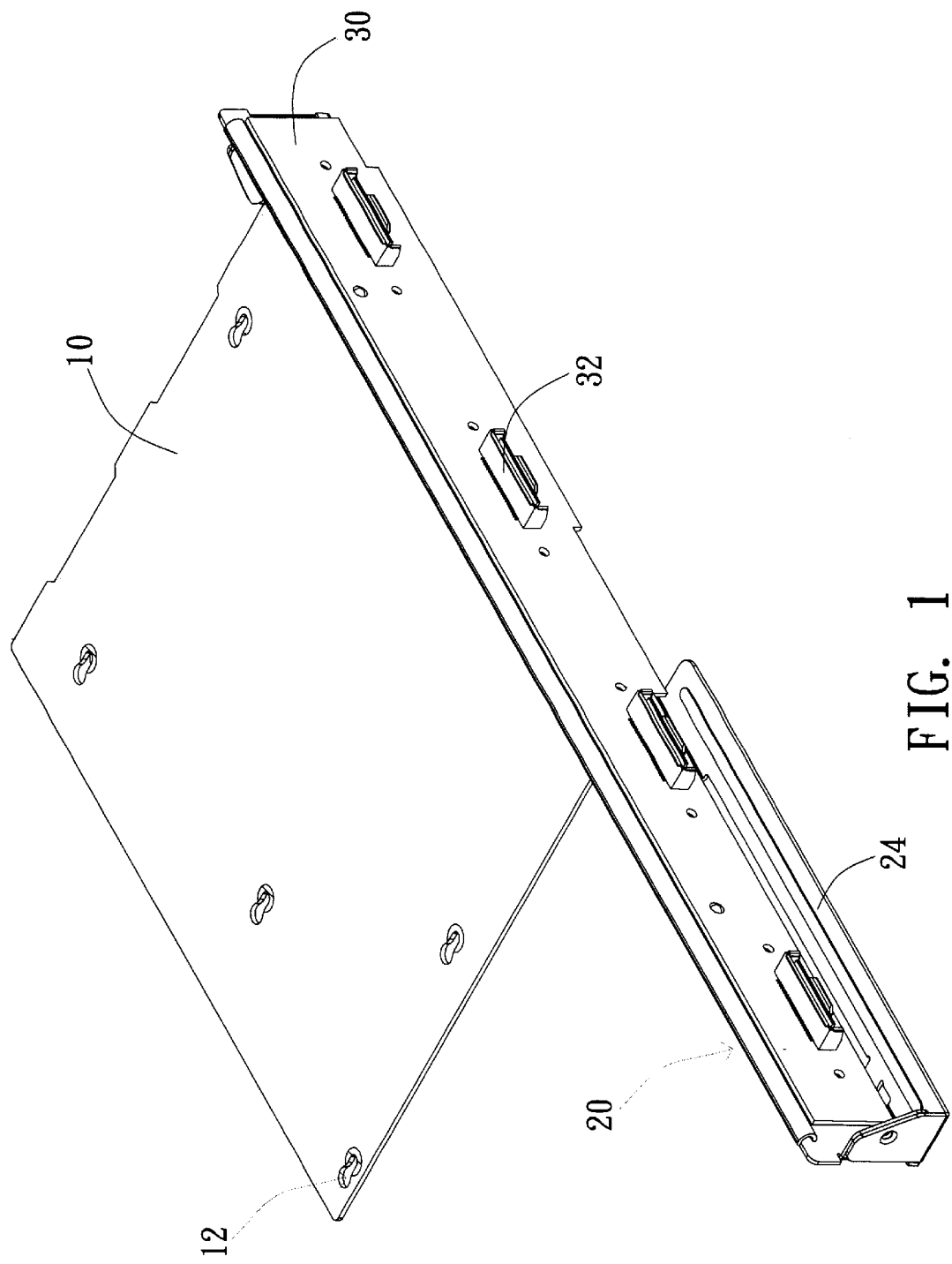
FIG. 1 is a perspective view of a motherboard module according to a preferred embodiment of the invention.
Figure 5A:
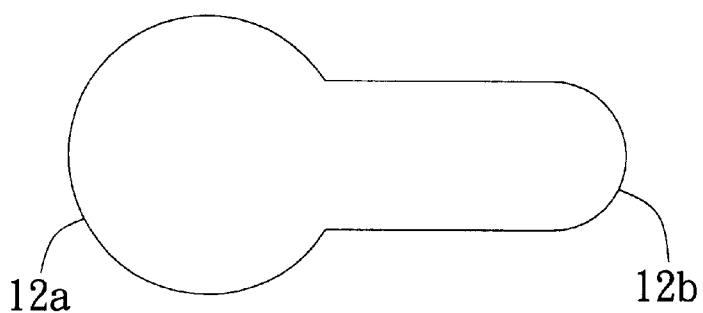
FIG. 5A is a top view of the slit shown in FIG. 2.

Referring to FIG. 1, a perspective view of a motherboard module according to a preferred embodiment of the invention is shown. As shown in FIG. 1, the motherboard module includes a motherboard 10, an upstanding structure 20, and a backboard 30. There are several slits 12 located on the motherboard 10. Besides, each of the slits has an inserting 12a end and a positioning end 12b, as shown in FIG. 5A. The upstanding structure 20, which is perpendicularly attached to the back edge of the motherboard 10, is used for positioning the motherboard 10. The backboard 30 has a plurality of expansion slots 32 mounted on, being coupled with the motherboard 10. Since the backboard 30 is adhered to one surface of the upstanding structure 20, the backboard 30 and the motherboard 10 are also perpendicular to each other. In addition, the motherboard module further includes a base 24 for supporting the upstanding structure 20. The base 24 is coupled to the bottom edge of the upstanding structure 20, forming a right angle with the upstanding structure 20. Therefore, the base 24 is substantially parallel with the motherboard 10 and perpendicular to the backboard 30.

Figure 2:
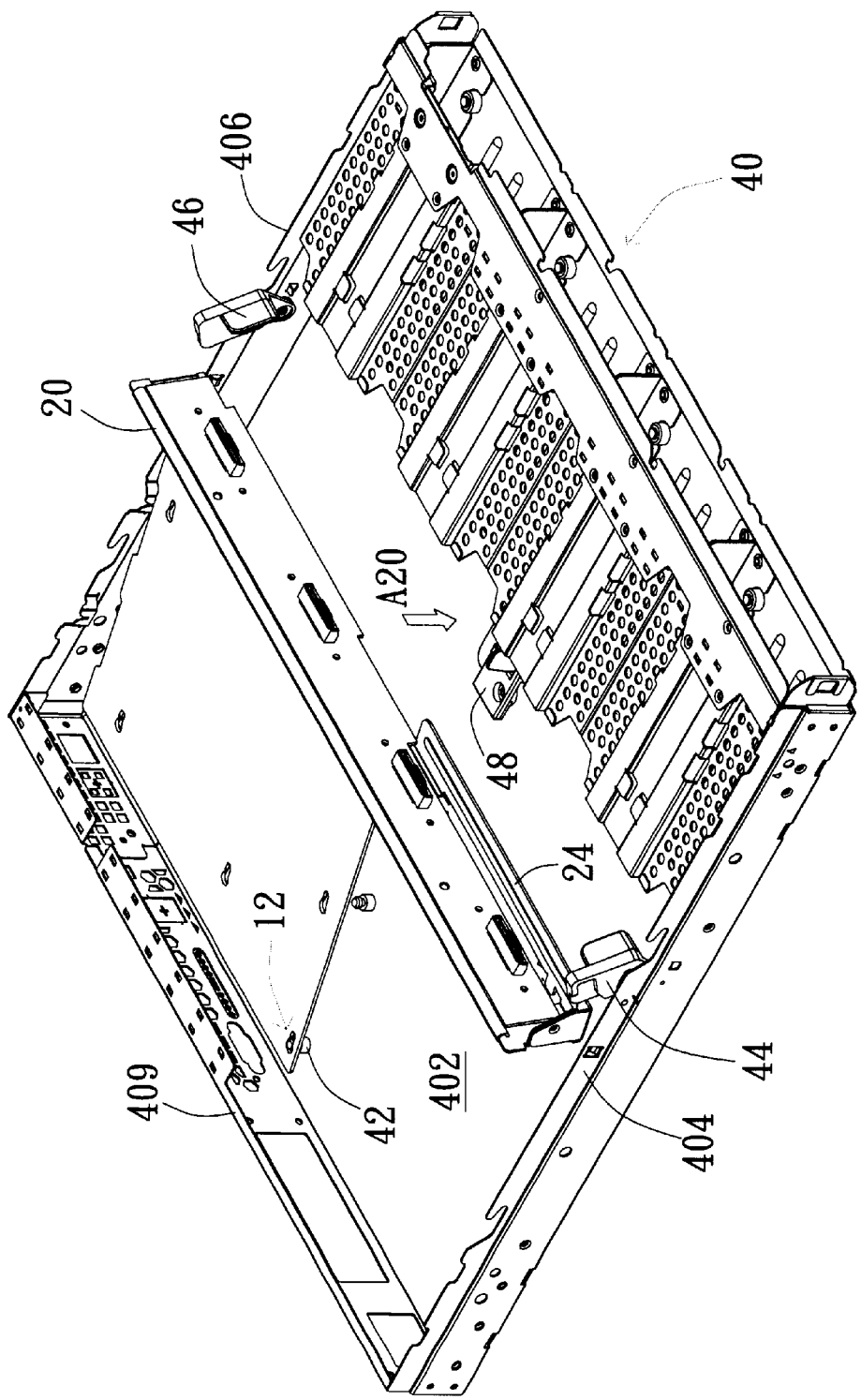
FIGS. 2 to 4 are perspective views illustrating the assembling procedures of the motherboard module according to the preferred embodiment of the invention.

As shown in FIG. 2, there are several uprights 42 disposed on the bottom surface 402 of the chassis 40. The fastener for securing the motherboard 10 to the chassis 40 preferably includes a first latch 44, a second latch 46, and a third latch 48. The first latch 44 is rotatably disposed on the left-side surface 404 of the chassis 40, the second latch 46 is rotatably disposed on the right-side surface 406 of the chassis 40, and the third latch 48 is rotatably disposed on the bottom surface 402 of the chassis 40.

Figure 3:
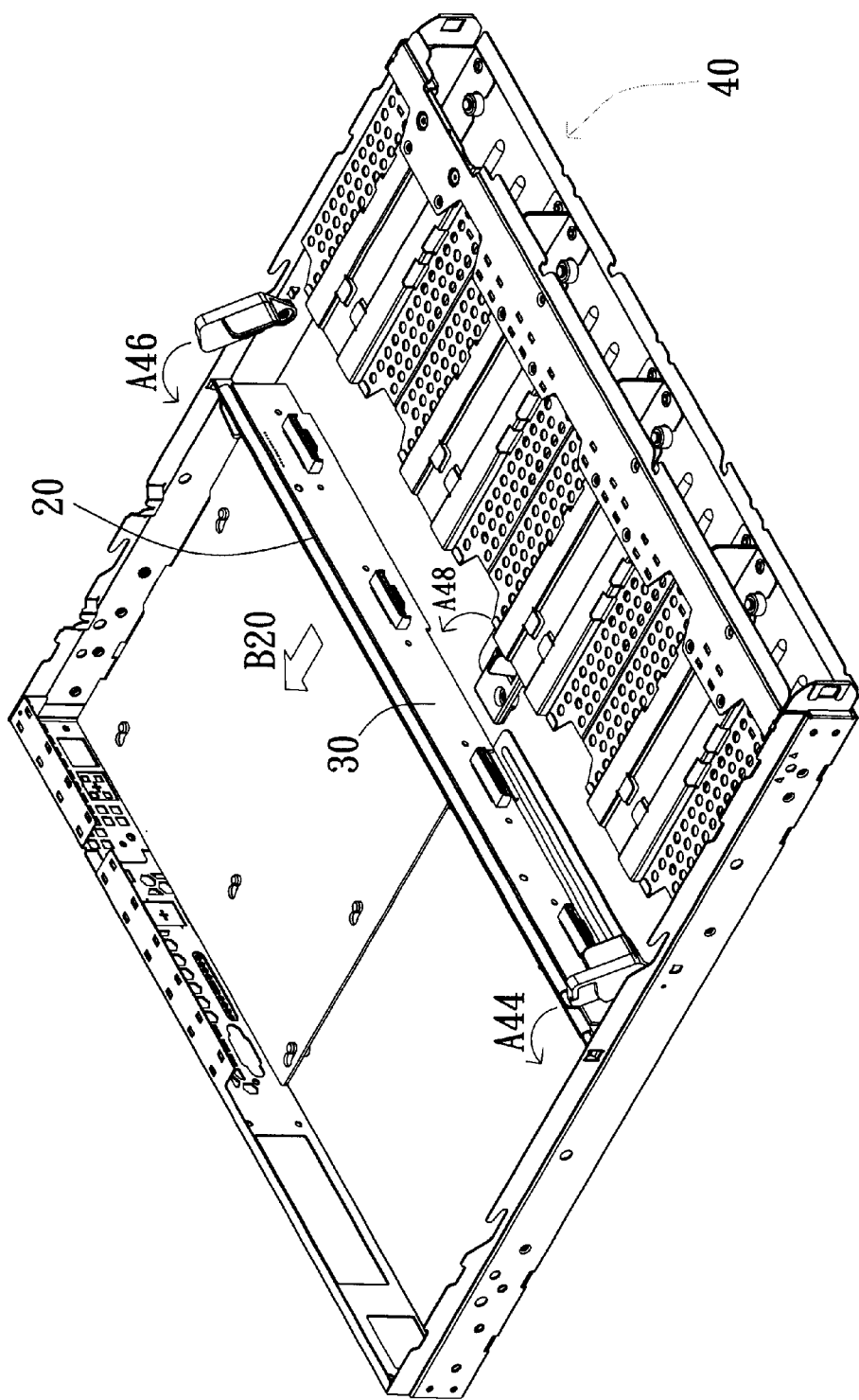
Figure 4:
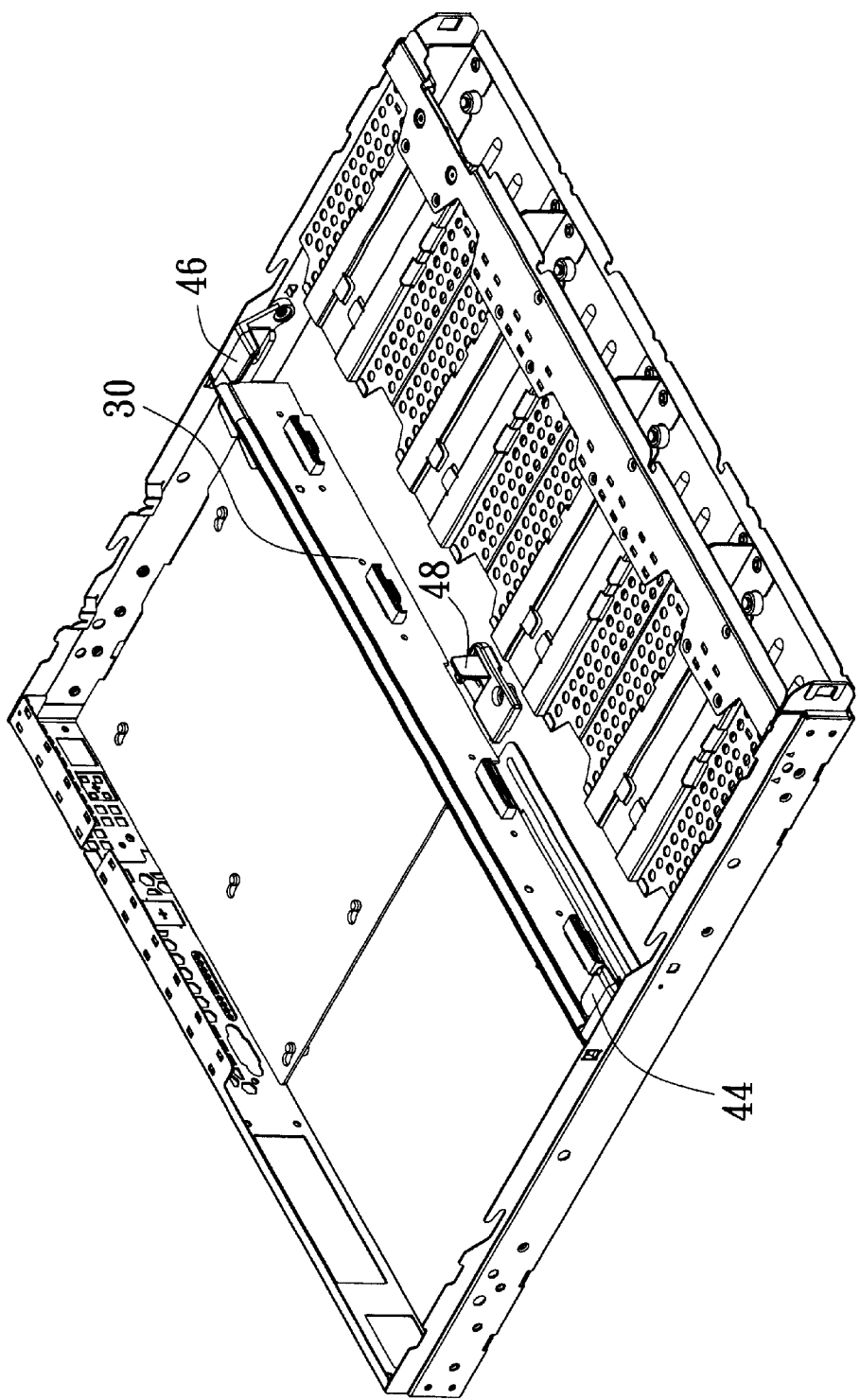
Figure 5B:
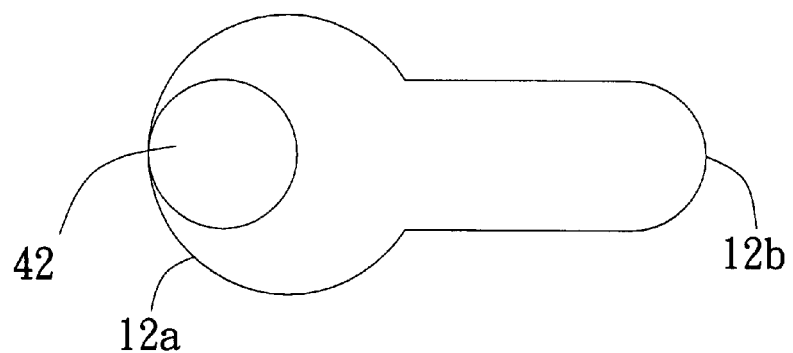
FIG. 5B is a top view of the slit and the upright shown in FIG. 3.

Referring to FIGS. 2 to 4, the assembling procedures of the motherboard module according to the preferred embodiment of the invention are illustrated. The approach to assemble the motherboard module to the chassis 40 is as follows: The motherboard 10 is first tilted in place so that the slits 12 located near the front edge of the motherboard 10 receive the uprights 42. After pushing the upstanding structure 20 along the direction of the arrow sign A20, all the uprights 42 are inserted in the corresponding slits 12 from the inserting end 12a as shown in FIG. 5B and the base 24 coupled to the bottom edge of the upstanding structure is set to support the upstanding structure 20. Hence, the motherboard module is then assembled to the chassis 40 in the initial position.

Figure 5C:
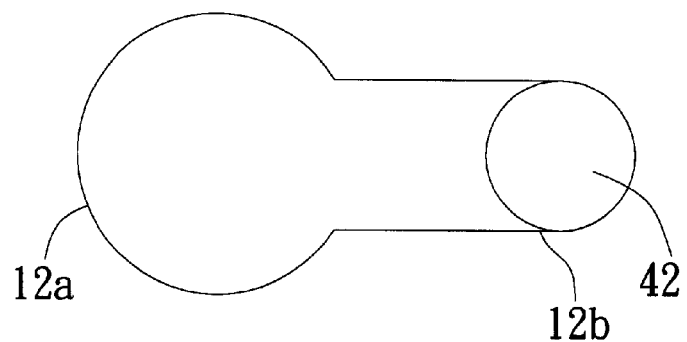
FIG. 5C is a top view of the slit and the upright shown in FIG. 4.

As shown in FIG. 3, the motherboard module enters into the final position by pushing the upstanding structure 20 along the direction of the arrow sign B20 and snapping on the fastener. Meanwhile, the uprights 42, which have been placed into the corresponding slits 12, relatively move from the inserting ends 12a to the positioning ends 12b as shown in FIG. 5C. Besides, the first latch 44, second latch 46, and third latch 48 are turned to the direction of A44, A46, and A48 for pressing the backboard 30 to secure the motherboard module to the chassis 40. The rotation face of A44 and A46 are parallel, while the rotation face of A44 (or A46) and A48 are perpendicular to each other. In FIG. 4, the assembly of the motherboard module is finished. The fastener pushes the backboard 30 due to the engagement of the first latch 44, second latch 46 and third latch 48 so that every upright 42 clinches the slit 12 at the positioning end 12b and the motherboard module is therefore positioned securely.

Figure 6:
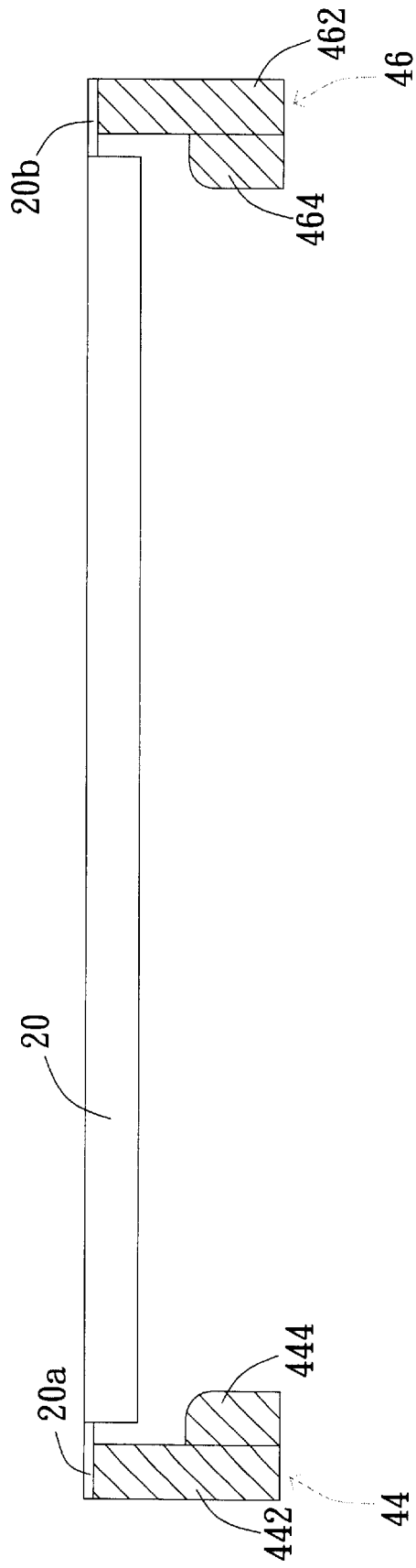
FIG. 6 is a top view of the engagement between latches and the upstanding module in FIG. 4.

Referring to FIG. 6, a top view of the engagement between latches and the upstanding module in FIG. 4 is shown. The first latch 44 includes a first latch body 442 and a first tab extension 444 while the second latch 46 includes a second latch body 462 and a second tab extension 464. The first tab extension 444 coupled with the latch body 442 and the second tab extension 464 coupled with the latch body 462 are used for being held in operation between a latching position and a non-latching position. As shown in FIG. 6, the first latch 44 and the second latch 46 are in a latching position after being snapped on respectively. The first latch body 442 engages the left end 20a of the upstanding structure 20 and the second latch body 462 engages the right end 20b of the upstanding structure 20 in order to push the backboard 30 forcibly.

The assembling procedures of the motherboard module according to the preferred embodiment of the invention are illustrated in sequence of FIG. 2 to FIG. 4. The motherboard 10 is assembled into the chassis 40 by pushing in the motherboard 10 to level at the uprights 42 in the chassis 40 and secured by snapping on the fastener. The disassembling procedures of the motherboard module according to the preferred embodiment of the invention are illustrated in sequence of FIG. 4 to FIG. 2 in the reverse operation. To quickly disassemble the motherboard, the first latch body 442 and the second latch body 462 are turned and disengaged from the left end 20a of the upstanding structure 20 and the right end 20b of the upstanding structure 20, and the uprights 42 release the slits 12, thereupon, the motherboard 10 can be separated from the chassis 40.

It achieves easy assembly and fast disassembly without the use of screws and tools. Therefore, the assembly and the disassembly of the motherboard no longer require complicated and laborious mounting procedures. The simplified assembly and disassembly procedures reduce labor costs.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A motherboard module, comprising:
    a motherboard having an elongated and tapered slit, wherein the slit is for receiving an upright on a bottom surface of a chassis;
    an upstanding structure perpendicularly attached to a back edge of the motherboard, for positioning the motherboard; and
    a backboard adhered to one surface of the upstanding structure, for being pressed by a fastener on the chassis.

2. The motherboard module according to claim 1, wherein the slit has an inserting end and a positioning end.

3. The motherboard module according to claim 2, wherein the motherboard is tilted in place so that the inserting end of the slit receives the upright while initial assembly of the motherboard.

4. The motherboard module according to claim 2, including a means for assembling the motherboard to the chassis wherein the upright is placed into the slit, and the upright relatively moves from the inserting end to the positioning end to clinch the slit at the positioning end.

5. The motherboard module according to claim 2, including a means for disassembling the motherboard from the chassis wherein the upright, which is placed into the slit, relatively moves from the positioning end to the inserting end to release the slit from the inserting end.

6. The motherboard module according to claim 1, wherein the fastener comprises a first latch rotatably disposed on a left-side surface of the chassis and a second latch rotatably disposed on a right-side surface of the chassis for engaging two ends of the backboard respectively.

7. The motherboard module according to claim 6, wherein the first latch has a first tab extension for being held in operation of snapping the first latch and the second latch has a second tab extension for being held in operation of snapping the second latch.

8. The motherboard module according to claim 1, wherein the fastener further comprises a third latch rotatably disposed on a bottom surface of the chassis for engaging the backboard.

9. The motherboard module according to claim 8, wherein the rotation face of the first latch and the second latch are parallel, while the rotation face of the first latch and the third latch are perpendicular to each other.

10. The motherboard module according to claim 1, wherein the motherboard module further comprises a base for supporting the upstanding structure.

11. The motherboard module according to claim 1, wherein the backboard has a plurality of expansion slots mounted on.

12. A modular mechanism for fast assembly and disassembly of a motherboard, comprising:
    an upright disposed on a bottom surface of a chassis, for engaging an elongated and tapered slit in the motherboard;
    an upstanding structure perpendicularly attached to a back edge of the motherboard, for positioning the motherboard, wherein a backboard adhered to one surface of the upstanding structure; and
    a fastener on the chassis, for pressing and engaging the backboard so that the upright clinches the slit and the motherboard is thus secured.

13. The modular mechanism according to claim 12, wherein the slit has an inserting end and a positioning end.

14. The modular mechanism according to claim 13, wherein the motherboard is tilted in place so that the inserting end of the slit receives the upright while initial assembly of the motherboard.

15. The modular mechanism according to claim 13, including a means for assembling the motherboard to the chassis wherein the upright is placed into the slit, and the upright relatively moves from the inserting end to the positioning end to clinch the slit at the positioning end.

16. The modular mechanism according to claim 13, including a means for disassembling the motherboard from the chassis wherein the upright, which is placed into the slit, relatively moves from the positioning end to the inserting end to release the slit from the inserting end.

17. The modular mechanism according to claim 12, wherein the fastener comprises a first latch rotatably disposed on a left-side surface of the chassis and a second latch rotatably disposed on a right-side surface of the chassis for engaging two ends of the backboard respectively.

18. The modular mechanism according to claim 17, wherein the first latch has a first tab extension for being held in operation of snapping the first latch and the second latch has a second tab extension for being held in operation of snapping the second latch.

19. The modular mechanism according to claim 12, wherein the fastener further comprises a third latch rotatably disposed on a bottom surface of the chassis for engaging the backboard.

20. The motherboard module according to claim 19, wherein the rotation face of the first latch and the second latch are parallel, while the rotation face of the first latch and the third latch are perpendicular to each other.

21. The modular mechanism according to claim 12, wherein the motherboard module further comprises a base for supporting the upstanding structure.

22. The modular mechanism according to claim 12, wherein the backboard has a plurality of expansion slots mounted on.

* * * * *